(12) United States Patent
Chang et al.

(10) Patent No.: US 11,558,976 B2
(45) Date of Patent: Jan. 17, 2023

(54) MECHANICAL ACTUATORS FOR ENGAGING A MOTHERBOARD SLED WITH A CHASSIS

(71) Applicant: QUANTA COMPUTER INC., Taoyuan (TW)

(72) Inventors: Chun Chang, Taoyuan (TW); Shih-Hsuan Hu, Taoyuan (TW); Wei-Cheng Tseng, Taoyuan (TW); Cheng-Feng Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/407,887

(22) Filed: Aug. 20, 2021

(65) Prior Publication Data

US 2022/0312621 A1    Sep. 29, 2022

Related U.S. Application Data

(60) Provisional application No. 63/316,867, filed on Mar. 26, 2021.

(51) Int. Cl.
*H05K 7/14* (2006.01)
*E05C 3/08* (2006.01)

(52) U.S. Cl.
CPC ......... *H05K 7/1487* (2013.01); *H05K 7/1489* (2013.01); *E05C 3/08* (2013.01)

(58) Field of Classification Search
CPC .. H05K 7/1402; H05K 7/1409; H05K 7/1411; H05K 7/1415; H05K 7/1417; H05K 7/1487; H05K 7/1489; G06F 1/183; G06F 1/184; G06F 1/185; G06F 1/186; G06F 1/187; G11B 33/124; Y10T 403/32501; E05C 3/06; E05C 3/08
USPC ...................................................... 361/679.59
See application file for complete search history.

(56) References Cited

U.S. PATENT DOCUMENTS

| | | | | | |
|---|---|---|---|---|---|
| 4,230,351 | A | * | 10/1980 | Bisbing | E05C 3/08 292/DIG. 49 |
| 4,648,009 | A | * | 3/1987 | Beun | H05K 7/1409 361/740 |
| 4,982,303 | A | * | 1/1991 | Krenz | G11B 33/124 360/137 |
| 6,483,717 | B1 | * | 11/2002 | Ives | H05K 7/1414 361/801 |
| 9,766,667 | B1 | * | 9/2017 | Singer | G06F 1/185 |
| 10,058,006 | B2 | * | 8/2018 | Hung | H05K 5/0221 |
| 10,485,123 | B1 | * | 11/2019 | Lin | H05K 5/0221 |
| 2020/0077537 | A1 | * | 3/2020 | Leung | H05K 7/1409 |

* cited by examiner

*Primary Examiner* — Abhishek M Rathod
*Assistant Examiner* — Gage Crum
(74) *Attorney, Agent, or Firm* — Nixon Peabody LLP (57) ABSTRACT

An electronic chassis includes a motherboard sled configured to engage in or out of the electronic chassis. The motherboard sled includes a housing and a mechanical actuator for engaging the motherboard sled into or out of an electronic chassis. The mechanical actuator includes at least one lever rotatably coupled to a hinge to form a first fulcrum adjacent to a vertical edge of a front surface of the housing. The mechanical actuator also includes a guiding arm adjacent to the hinge and mechanically connected to the at least one lever to form a second fulcrum. The guiding arm rotates between a secured position adjacent to the front surface and an unsecured position away from the front surface.

20 Claims, 8 Drawing Sheets

MECHANICAL ACTUATORS FOR ENGAGING A MOTHERBOARD SLED WITH A CHASSIS

CROSS-REFERENCE TO RELATED APPLICATIONS

This application claims priority from and benefit of U.S. Provisional Application No. 63/166,867, entitled "Double Fulcrum Lever Design To Solve The MB Sled And I/O Sleds Connectors Mating Force Live Up To 152.8 kg," and filed on Mar. 26, 2021. The contents of that application are hereby incorporated by reference in their entirety.

FIELD OF THE INVENTION

The present invention relates generally to mechanical actuators, and more specifically, to mechanical actuators for engaging a motherboard sled with an electronic chassis.

BACKGROUND OF THE INVENTION

A server is a specialized computer system that includes numerous electrical components integrated into a single unit within an electronic chassis. Common to all servers is a motherboard including a processing unit such as a Graphics Processing Unit (GPU) or a Central Processing Unit (CPU), memory device slots (e.g., DDR3, DDR4, DRAM), PCIe slots, and connectors to other components, such as hard drives, a power supply, and peripherals (e.g., universal serial bus (USB) ports, local area network (LAN), and other input-output (I/O) ports). The motherboard is placed on a motherboard sled, which is stacked under an input-output (I/O) sled having an input-output (I/O) card, prior to assembly into the electronic chassis of the server. The stacked arrangement of motherboard sled containing the motherboard and the I/O sled containing the I/O card is connected with GPU cards in the electronic chassis of a S7W server.

Four connectors on the motherboard and four connectors on the I/O card are mated with eight connectors of the GPU cards in the electronic chassis of the S7W server. Each of the connectors on the motherboard and the I/O card includes four hundred and sixteen (416) pins. The mating force applied at each pin is up to about 0.45 Newtons. Thus, the total mating force for connecting with all eight connectors of the GPU cards is about (8×416×0.45) Newtons=1497.6 Newtons=152.8 Kilogram force. Accordingly, it is desirable to have a mechanical actuator with sufficient mechanical advantage that can efficiently engage the motherboard sled, which carries the weight of the motherboard, the I/O sled, and the I/O card, with the electronic chassis of the server such that the motherboard sled can be easily placed into and out of the electronic chassis.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a motherboard sled includes a housing and a mechanical actuator for engaging the motherboard sled into or out of an electronic chassis. The mechanical actuator includes at least one lever rotatably coupled to a hinge to form a first fulcrum adjacent to a vertical edge of a front surface of the housing. The mechanical actuator also includes a guiding arm adjacent to the hinge and mechanically connected to the at least one lever to form a second fulcrum. The guiding arm rotates between a secured position adjacent to the front surface and an unsecured position away from the front surface.

According to certain aspects of the present disclosure, the guiding arm is further connected to the at least one lever through a linking member.

According to certain aspects of the present disclosure, the guiding arm further includes a handle portion having a first having a first end to which the at least one lever is mechanically connected, and a blade portion formed at a second end of the handle portion. The first end is proximal to the hinge and the second end is distal from the hinge.

According to certain aspects of the present disclosure, the blade portion includes a ridged outer surface.

According to certain aspects of the present disclosure, the mechanical actuator provides a mechanical advantage of up to about 1:22.

According to certain aspects of the present disclosure, the vertical edge is a left edge of the front surface of the housing, or a right edge of the front surface of the housing.

According to certain aspects of the present disclosure, the mechanical actuator further includes another lever rotatably coupled to another hinge forming a third fulcrum adjacent to a right edge of the front surface, and another guiding arm adjacent to the another hinge and mechanically connected to the another lever to form a fourth fulcrum. The another guiding arm rotates between a respective secured position and an unsecured position.

According to certain aspects of the present disclosure, the another guiding arm further includes a handle portion having a first end to which the another lever is mechanically connected, and a blade portion formed at a second end of the handle portion. The first end is proximal to the hinge and the second end is distal from the hinge.

According to certain aspects of the present disclosure, the blade portion includes a ridged outer surface.

According to certain aspects of the present disclosure, the housing further includes a latching mechanism configured to secure the guiding arm in the secured position.

According to certain aspects of the present disclosure, an electronic chassis includes a motherboard sled configured to engage in or out of the electronic chassis. The motherboard sled includes a housing and a mechanical actuator. The mechanical actuator includes a first lever, a first guiding arm, a second lever, and a second guiding arm. The first lever is rotatably coupled to a first hinge to form a first fulcrum adjacent to a first end of the front surface of the housing. The first guiding arm is adjacent to the first hinge. The first guiding arm is coupled directly to the first lever to form a second fulcrum and indirectly by a first linking member. The first guiding arm rotates between a secured positon adjacent to the front surface and an unsecured position away from the front surface. The second lever is rotatably coupled to a second hinge to form a third fulcrum adjacent to a second end of the front surface, wherein the second end is opposite to the first end. The second guiding arm is adjacent to the second hinge. The second guiding arm is coupled directly to the second lever to form a fourth fulcrum and indirectly by a second linking member. The second guiding arm rotates between a respective secured position adjacent to the front surface and an unsecured position away from the front surface.

According to certain aspects of the present disclosure, the first end is a left edge of the front surface of the housing and the second end is a right edge of the front surface of the housing.

According to certain aspects of the present disclosure, a method for providing engagement between a motherboard sled and an electronic chassis is disclosed. The method includes rotatably coupling at least one lever of a mechanical actuator in a motherboard sled to a hinge adjacent to a vertical edge of a front surface of a housing of the motherboard sled. The method further includes forming a first fulcrum by the coupling between the at least one lever and the hinge, and then mechanically connecting the at least one lever to a guiding arm of the mechanical actuator adjacent to the hinge. The method further includes forming a second fulcrum by the mechanically connecting between the at least one lever and the guiding arm. The method further includes allowing rotation of the guiding arm between an unsecured position away from the front surface and a secured position adjacent to the front surface, and in response to the rotation, providing an engagement motion to slide the motherboard sled into or out of the electronic chassis.

According to certain aspects of the present disclosure, the method is performed wherein the guiding arm is further connected to the at least one lever through a linking member.

According to certain aspects of the present disclosure, the method is performed wherein the guiding arm includes a handle portion having a first end to which the at least one lever is mechanically connected in proximity of the hinge and a second end on which a blade portion is formed distal from the hinge.

According to certain aspects of the present disclosure, the method is performed wherein the vertical edge is a left edge of the front surface of the housing, or a right edge of the front surface of the housing.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to mechanical actuators for engaging a motherboard sled with an electronic chassis of a server. The mechanical actuators include a lever rotatably coupled to a hinge forming a first fulcrum adjacent to a vertical edge of a front surface of the motherboard sled and a guiding arm mechanically connected to the lever adjacent to the hinge forming a second fulcrum. The double-fulcrum design of the mechanical actuators enables sufficient mechanical advantage to move weight of electronic assemblies disposed on the motherboard sled and connect with GPU cards of the server, as the motherboard is engaged into and out of the electronic chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
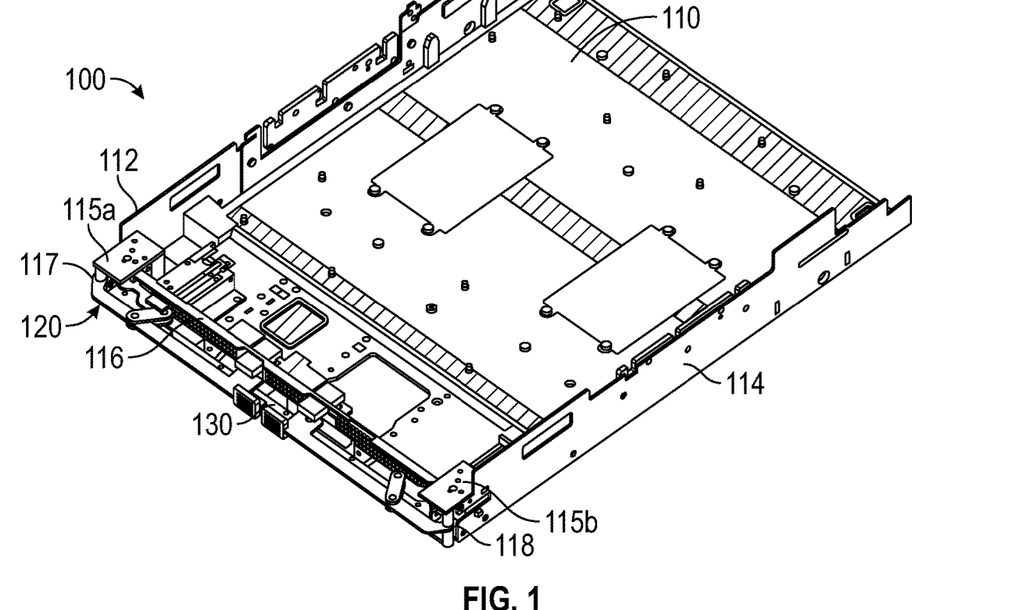
FIG. 1 shows a front perspective view of a motherboard sled with mechanical actuators in a secured position, according to certain aspects of the present disclosure.
Figure 2:
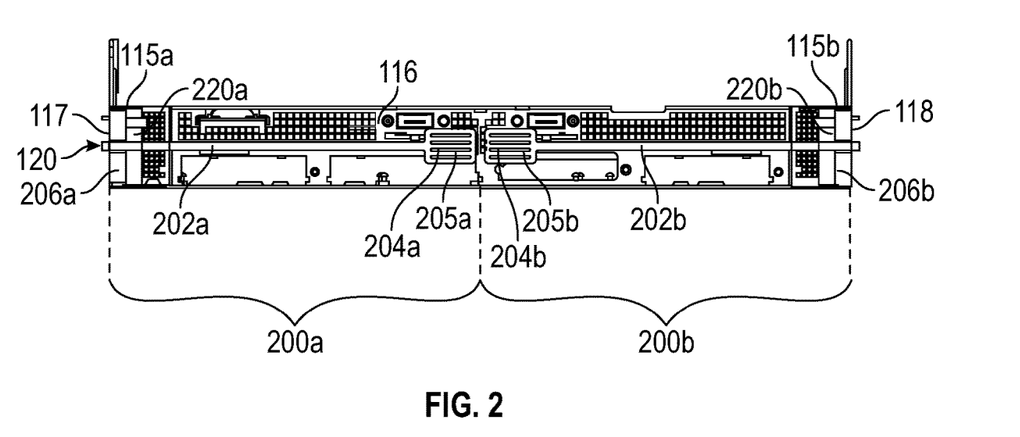
FIG. 2 shows a front side view of the motherboard sled of FIG. 1, according to certain aspects of the present disclosure.
Figure 3:
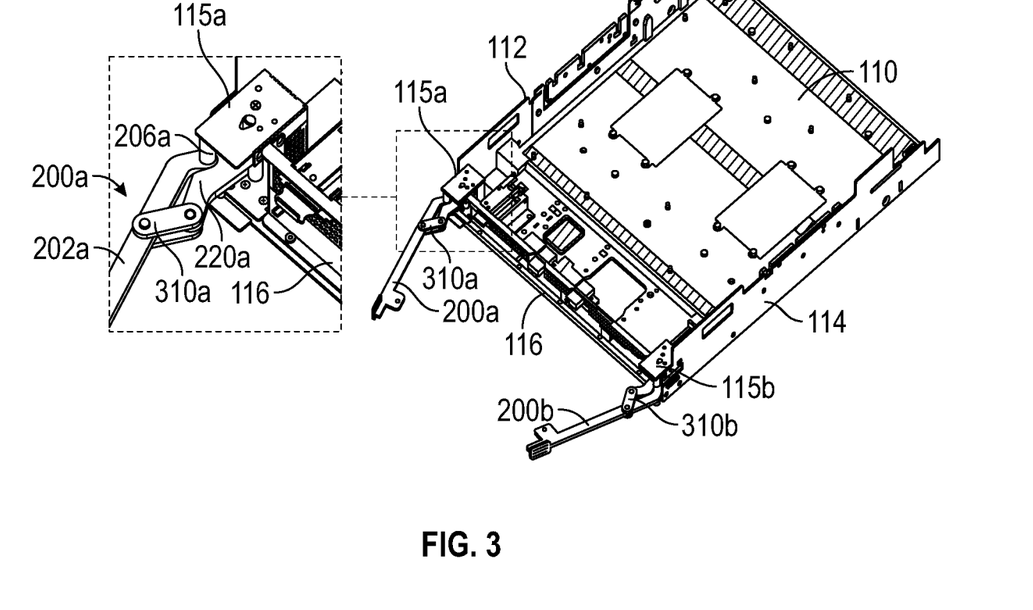
FIG. 3 shows a front perspective view of the motherboard sled of FIG. 1 with mechanical actuators in an unsecured position, according to certain aspects of the present disclosure.

Referring to the figures, FIGS. 1-2 show a front perspective view and a front side view of a motherboard sled 100. The motherboard sled 100 is used for carrying a motherboard 785 (shown in FIGS. 7-8) and engaging with an electronic chassis 700 (shown in FIGS. 7-9) of a server. The motherboard sled 100 includes a housing 110 and a mechanical actuator 120. FIGS. 1-2 show the mechanical actuator 120 in a secured position after engaging the motherboard sled 100 into the electronic chassis 700. FIG. 3 shows a front perspective view of the motherboard sled 100 with the mechanical actuator 120 in an unsecured position, after moving the motherboard sled 100 out from the electronic chassis 700 (shown in FIGS. 7-9), or before engaging the motherboard sled 100 into the electronic chassis 700.

In the non-limiting embodiment shown in FIGS. 1-3, the housing 110 of the motherboard sled 100 includes a front surface 116, a first wall 112 on the left side, and a second wall 114 on the right side. The front surface 116 has a first vertical edge 117 on the left end, and a second vertical edge 118 on the right end. A first hinge 115a is disposed adjacent to the first vertical edge 117 on the left end. A second hinge 115b is disposed adjacent to the second vertical edge 118 on the left end.

The mechanical actuator 120 includes at least one lever 220a and at least one guiding arm 200a. As shown in the non-limiting embodiments of FIGS. 2-3, the mechanical actuator 120 has a first lever 220a and a first guiding arm 200a on the left side, and a second lever 220b and a second guiding arm 200b on the right side. The first guiding arm 200a and the second guiding arm 200b can be made from a metal, an alloy, or even a composite material. The first guiding arm 200a and the second guiding arm 200b are designed to accommodate limited design space on the motherboard sled 100, and thereby, prevent any venting holes on the front surface 116 from being blocked. In a different embodiment, the mechanical actuator 120 may have only a single lever and a single guiding arm.

Figure 7:
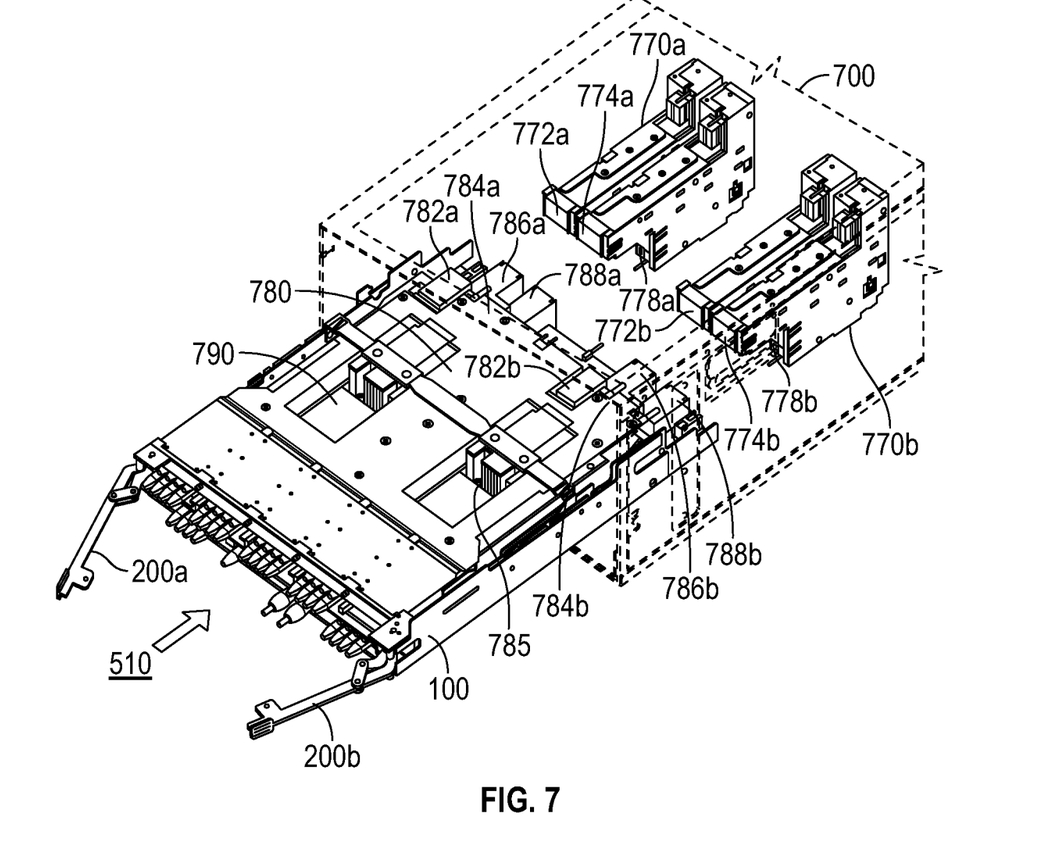
FIG. 7 shows a perspective view of the mechanical actuator in the unsecured position before being used for engaging the motherboard sled of FIG. 1 into an electronic chassis, according to certain aspects of the present disclosure.
Figure 8:
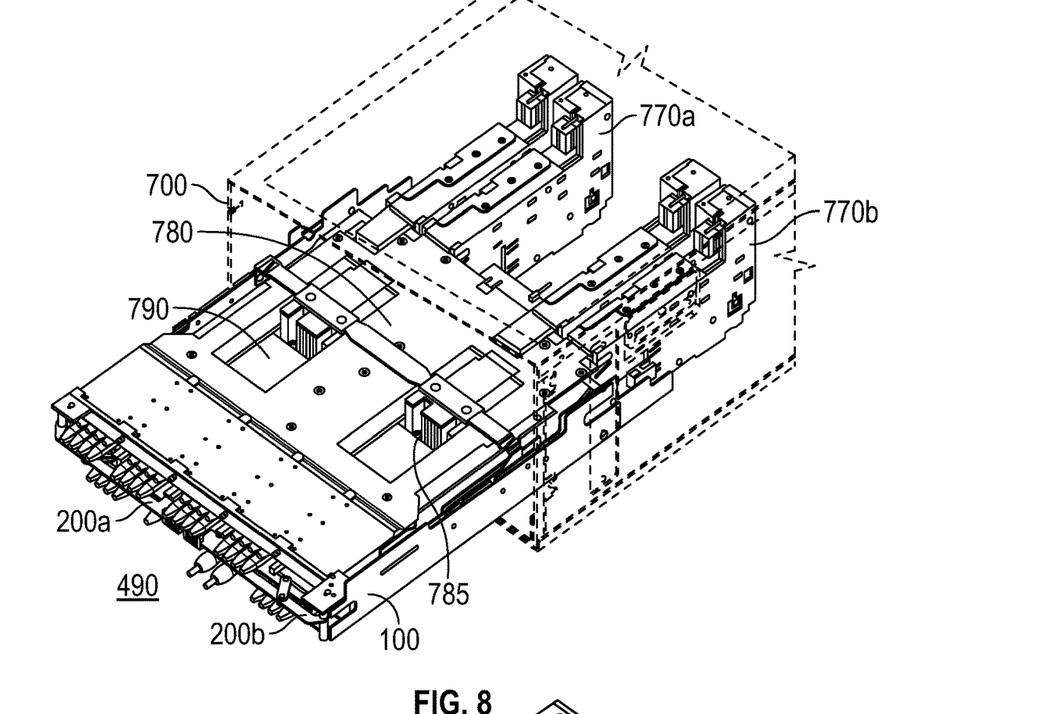
FIG. 8 shows a perspective view of the mechanical actuator in the secured position after the motherboard sled has engaged in the electronic chassis, according to certain aspects of the present disclosure.

As shown in FIG. 3 and also FIGS. 7-8, the first guiding arm 200a and the second guiding arm 200b are configured to rotate between an unsecured position 510 (FIG. 7) away from the front surface 116 of the motherboard sled 100 and a secured position 490 (FIG. 7) adjacent to the front surface 116 to slide the motherboard sled 100 into or out of the electronic chassis 700.

Referring back to FIGS. 2-3, the first lever 220a is rotatably coupled to the first hinge 115a on the left side of the front surface 116. The coupling of the first lever 220a with the first hinge 115a forms a first fulcrum 450a (shown in FIGS. 4A-5A) that is adjacent to the first vertical edge 117 of the front surface 116 of the motherboard sled 100. The first guiding arm 200a is mechanically connected directly to the first lever 220a adjacent to the first hinge 115a to form a second fulcrum 460a (shown in FIGS. 4A-5A), and also indirectly by a first linking member 310a (shown in FIG. 3 and FIGS. 4A-5A).

Continuing to refer to FIGS. 2-3, the second lever 220b is rotatably coupled to the second hinge 115b on the right side of the front surface 116. The coupling of the second lever 220b with the second hinge 115b forms a third fulcrum 450b (shown in FIGS. 4B-5B) that is adjacent to the second vertical edge 118 of the front surface 116 of the motherboard sled 100. The second guiding arm 200b is mechanically connected directly to the second lever 220b adjacent to the second hinge 115b to form a fourth fulcrum 460b (shown in FIGS. 4B-5B), and also indirectly by a second linking member 310b (shown in FIGS. 4B-5B).

Figure 4A:
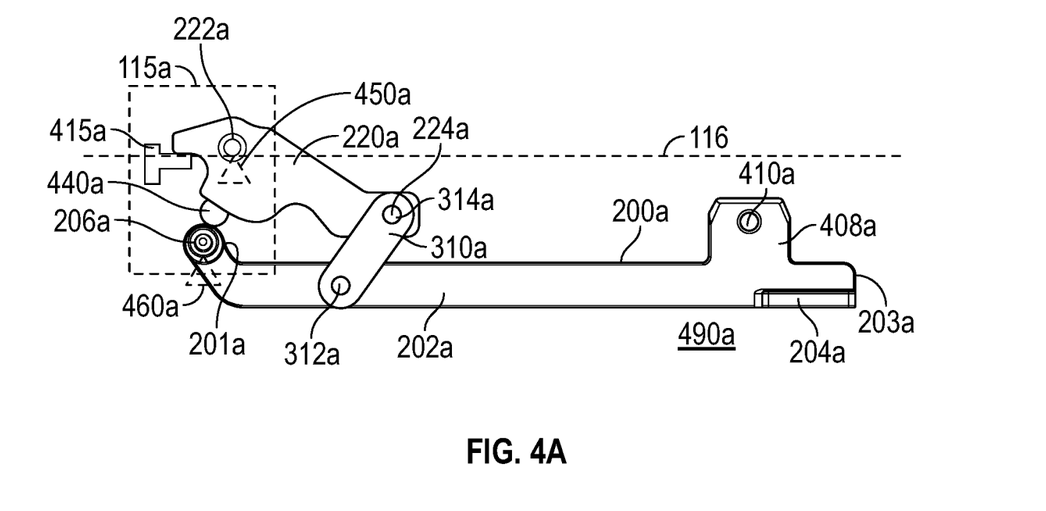
FIG. 4A shows a top view of a guiding arm and lever coupled to a left hinge of the mechanical actuator in the secured position, according to certain aspects of the present disclosure.
Figure 5A:
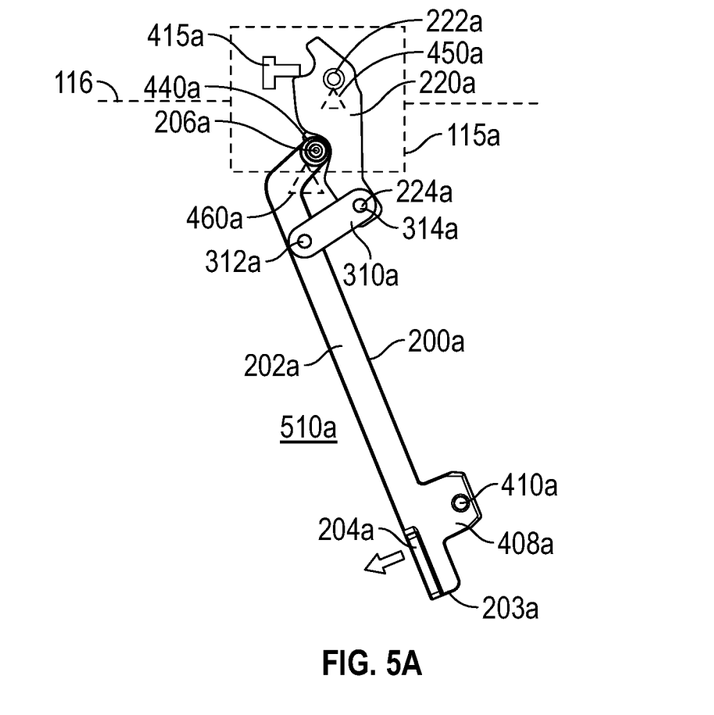
FIG. 5A shows a top view of the guiding arm and lever coupled to the left hinge of the mechanical actuator in the unsecured position, according to certain aspects of the present disclosure.

FIGS. 4A-5A show top views of the first guiding arm 200a and the first lever 220a coupled to the first hinge 115a in the secured position 490a and the unsecured position 510a, respectively. In particular, the first guiding arm 200a and the first lever 220a are coupled to a first hinge point 415a of the first hinge 115a along the first vertical edge 117 (see FIGS. 1-2) on the left side of the front surface 116. In the embodiments shown in FIGS. 4A-5A, the first guiding arm 200a is parallel to the front surface 116 in the secured position 490a (FIG. 4A), while the first guiding arm 200a forms an angle of about 75 degrees with the front surface 116, when fully extended in the unsecured position 510a (FIG. 5A). The first lever 220a forms an angle of about 60 degrees with the front surface 116 in the unsecured position 510a.

The first guiding arm 200a includes a first handle portion 202a having a first end 201a proximal to the first hinge 115a, and a second end 203a distal from the first hinge 115a. The first guiding arm 200a also includes a first pivoting cylinder 206a at the first end 201a, and a first blade portion 204a formed at the second end 203a. The first pivoting cylinder 206a is mechanically coupled to the first lever 220a adjacent to the first hinge point 415a through a first ball-and-socket joint 440a, thereby forming the second fulcrum 460a.

The first handle portion 202a is configured to be mechanically connected to the first lever 220a at the first end 201a along the first pivoting cylinder 206a adjacent to the first hinge 115a. The first blade portion 204a has a ridged outer surface 205a (shown in FIG. 2). The first blade portion 204a includes a first rearward tab 408a. The first rearward tab 408a includes a first hole 410a configured to mate with the latching mechanism 130 (shown in FIGS. 1 and 6A-6B) for securing the first guiding arm 200a in the secured position 490a.

The first lever 220a has a first aperture 222a for coupling to the first hinge point 415a to form the first fulcrum 450a. The first lever 220a also includes a second aperture 224a for coupling to the first linking member 310a. The first linking member 310a includes a first opening 312a through which it is fastened to the first handle portion 202a, and a second opening 314a through which it is fastened to the first lever 220a.

Figure 4B:
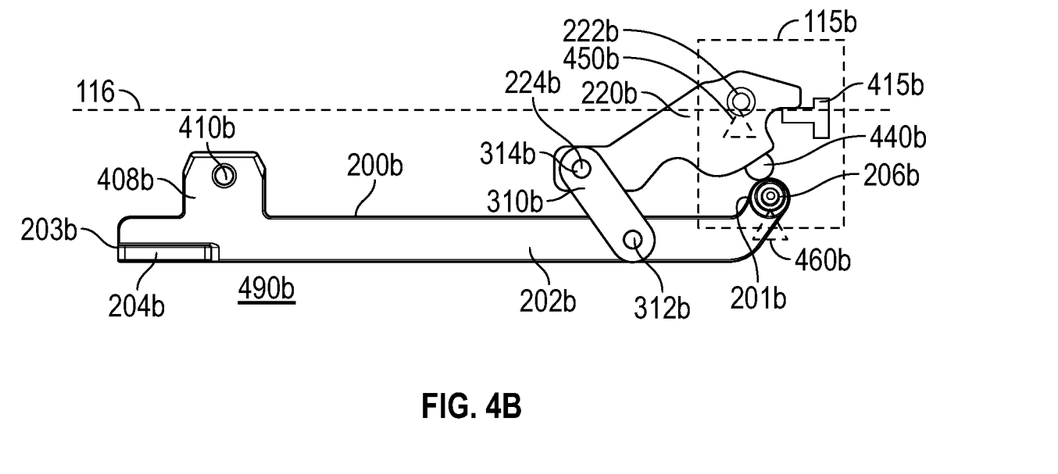
FIG. 4B shows a top view of a guiding arm and lever coupled to a right hinge of the mechanical actuator in the secured position, according to certain aspects of the present disclosure.
Figure 5B:
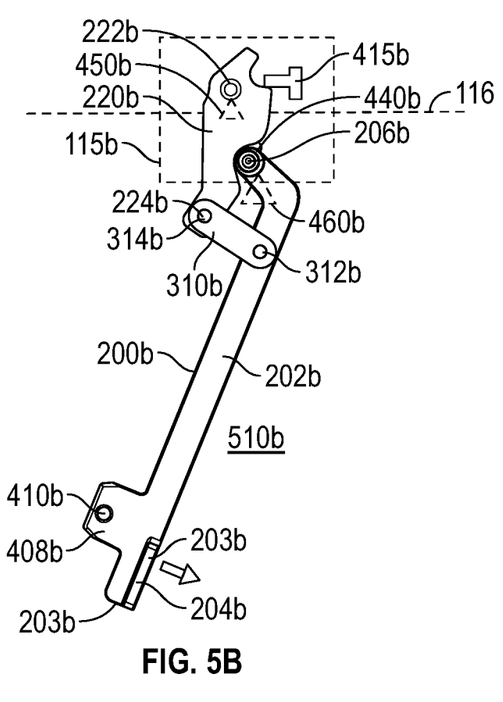
FIG. 5B shows a top view of the guiding arm and lever coupled to the right hinge of the mechanical actuator in the unsecured position, according to certain aspects of the present disclosure.

FIGS. 4B-5B show top views of the second guiding arm 200b and the second lever 220b coupled to the second hinge 115b in the secured position 490b and the unsecured position 510b, respectively. In particular, the second guiding arm 200b and the second lever 220b are coupled to a second hinge point 415b of the second hinge 115b along the second vertical edge 118 (see FIGS. 1-2) on the right side of the front surface 116. In the embodiments shown in FIGS. 4B-5B, the second guiding arm 200b is parallel to the front surface 116 in the secured position 490b (FIG. 4B), while the second guiding arm 200b forms an angle of about 75 degrees with the front surface 116, when fully extended in the unsecured position 510b (FIG. 5B). The second lever 220b forms an angle of about 60 degrees with the front surface 116 in the unsecured position 510b.

The second guiding arm 200b includes a second handle portion 202b having a first end 201b proximal to the second hinge 115b, and a second end 203b distal from the second hinge 115b. The second guiding arm 200b also includes a second pivoting cylinder 206b at the first end 201b, and a second blade portion 204b formed at the second end 203b. The second pivoting cylinder 206b is mechanically coupled to the second lever 220b adjacent to the second hinge point 415b through a second ball-and-socket joint 440b, thereby forming the fourth fulcrum 460b.

The second handle portion 202b is configured to be mechanically connected to the second lever 220b at the first end 201b along the second pivoting cylinder 206b adjacent to the second hinge 115b. The second blade portion 204b has a ridged outer surface 205b (shown in FIG. 2). The second blade portion 204b includes a second rearward tab 408b. The second rearward tab 408b includes a second hole 410b configured to mate with the latching mechanism 130 (shown in FIGS. 1 and 6A-6B) for securing the second guiding arm 200b in the secured position 490b.

The second lever 220b has a first aperture 222b for coupling to the second hinge point 415b to form the third fulcrum 450b. The second lever 220b also includes a second aperture 224b for coupling to the second linking member 310b. The second linking member 310b includes a first opening 312b through which it is fastened to the second handle portion 202b, and a second opening 314b through which it is fastened to the second lever 220b.

When the first guiding arm 200a and the second guiding arm 200b are in the secured position 490a/490b, the first blade portion 204a of the first guiding arm 200a and the second blade portion 204b of the second guiding arm 200b become adjacent to a central location along the front surface 116 of the motherboard sled 100 (shown in FIG. 1). A latching mechanism 130 (shown in FIGS. 1 and 6A-6B) adjacent to the central location may be used to secure the first guiding arm 200a and the second guiding arm 200b in the secured position.

Figure 6A:
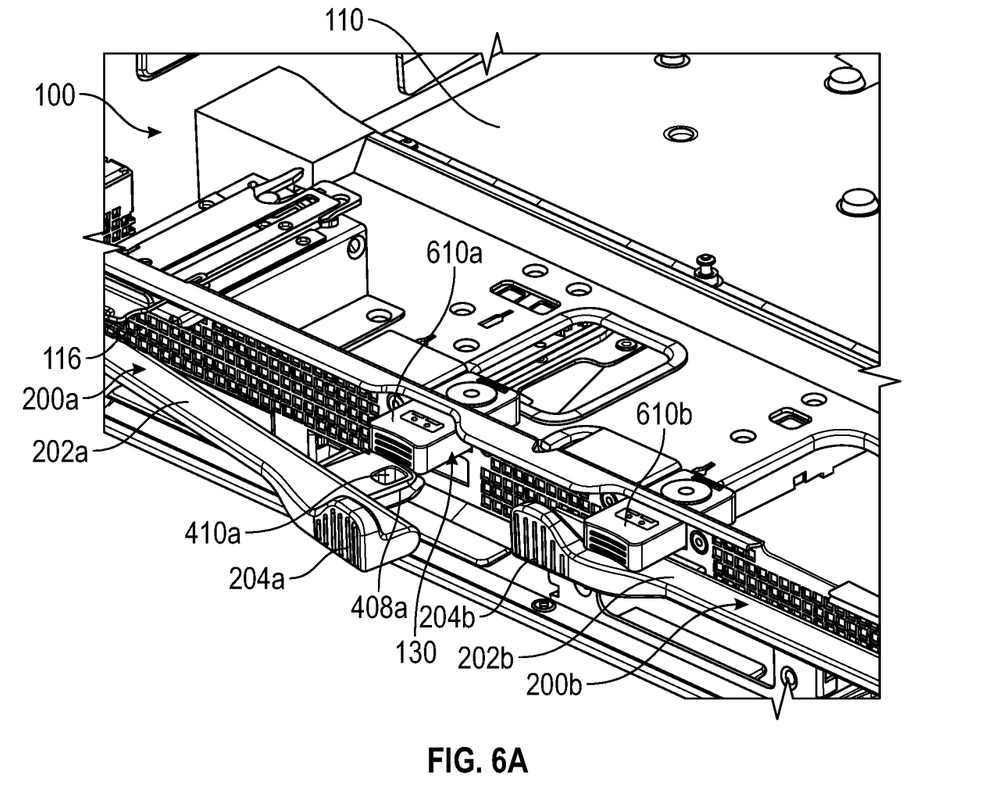
FIG. 6A shows a top perspective view of the latching mechanism used to secure the guiding arms coupled to the left hinge and the right hinge of the mechanical actuator, according to certain aspects of the present disclosure.
Figure 6B:
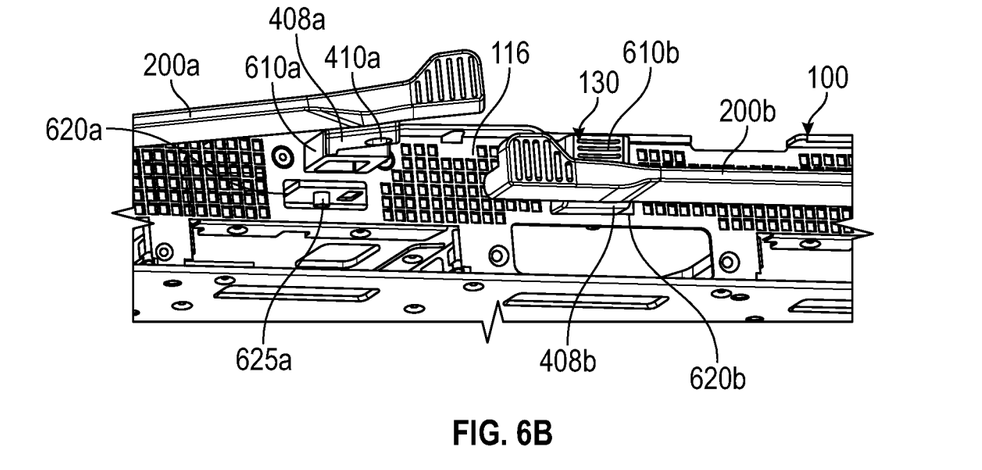
FIG. 6B shows a bottom perspective view of the latching mechanism used to secure the guiding arms coupled to the left hinge and the right hinge of the mechanical actuator, according to certain aspects of the present disclosure.

FIGS. 6A-6B shows top and bottom perspective views of an example latching mechanism 130 used to secure the first guiding arm 200a and the second guiding arm 200b. The latching mechanism 130 is disposed on the front surface 116 of the housing 110 of the motherboard sled 100. The latching mechanism 130 includes two latching components 610a and 610b on either side of a central location on the front surface 116 such that the first guiding arm 200a is stowed under the latching component 610a and the second guiding arm 200b is stowed under the latching component 610b in the secured position 490a/490b (FIGS. 4B, 5B). The front surface 116 has a first slot 620a under the latching component 610a and a second slot 620b under the latching component 610b. When the first guiding arm 200a is stowed under the latching component 610a, the first blade portion 204a passes through the first slot 620a such that the first hole 410a on the first rearward tab 408a mates with a first knob 625a just interior of the front surface 116 of the housing 110. Similarly, when the second guiding arm 200b is stowed under the latching component 610b, the second blade portion 204b passes through the second slot 620b such that the second hole 410b on the second rearward tab 408b mates with a second knob 625b (not shown) just interior of the front surface 116 of the housing 110. Accordingly, the first guiding arm 200a and the second guiding arm 200b are secured to the housing 110 with the latching mechanism 130.

FIG. 7 shows a perspective view of the mechanical actuator 120 (FIG. 1) before being used for engaging the motherboard sled 100 (FIG. 1) into the electronic chassis 700, and FIG. 8 shows a perspective view after the motherboard sled 100 has engaged into the electronic chassis 700. In FIG. 7, the first guiding arm 200a and the second guiding arm 200b are in the unsecured position 510. The motherboard sled 100 includes the motherboard 785 and is stacked under an input-output (I/O) sled 780 having an input-output (I/O) card 790. The motherboard 785 has four connectors 786a, 788a, 786b, 788b, while the I/O card 790 has four connectors 782a, 784a, 782b, 784b. The electronic chassis 700 includes a first GPU card 770a having four connectors 772a, 774a, 776a (not shown), 778a and a second GPU card 770b having four connectors 772b, 774b, 776b (not shown), 778b. The eight connectors 772a, 774a, 776a, 778a, 772b, 774b, 776b, 778b of the GPU cards 770a, 770b are configured to mate with the four connectors 782a, 784a, 782b, 784b of the I/O card 790 and the four connectors 786a, 788a, 786b, 788b of the motherboard 785.

In FIG. 8, the first guiding arm 200a and the second guiding arm 200b have moved into the secured position 490. In this position, the motherboard 785 and the I/O card 790 are fully connected with the GPU cards 770a, 770b since the eight connectors 772a, 774a, 776a, 778a, 772b, 774b, 776b, 778b of the GPU cards 770a, 770b are mated with the four connectors 782a, 784a, 782b, 784b of the I/O card 790 and the four connectors 786a, 788a, 786b, 788b on the motherboard 785. Upon assembly, the first guiding arm 200a and the second guiding arm 200b are placed in the secured position 490 and secured using the latching mechanism 130 (shown in FIG. 1).

Continuing to refer to FIGS. 7-8, the first guiding arm 200a and the second guiding arm 200b, in operation, are rotated from the unsecured position 510 to the secured position 490 to slide the motherboard sled 100 into the electronic chassis 700, such that the motherboard 785 and the I/O card 790 can mate with the GPU cards 770a, 770b therein. The double-fulcrum design of each of the first guiding arm 200a and the second guiding arm 200b in the mechanical actuator 120 enables (i) the mating force for connecting with the GPU cards 770a, 770b and (ii) the weights of the motherboard sled 100 carrying the motherboard 785, as well as the I/O sled 780 having the I/O card 790, to be easily moved by applying relatively little force on the second end 203a (shown in FIGS. 4A-5A) of the first guiding arm 200a and the second end 203b (shown in FIGS. 4B-5B) of the second guiding arm 200b.

Each of the four connectors on the motherboard 785 and the I/O card 790 includes four hundred and sixteen (416) pins. The mating force applied at each pin is up to about 0.45 Newtons. Thus, the total mating force for connecting with all eight connectors 772a, 774a, 776a, 778a, 772b, 774b, 776b, 778b of the GPU cards 770a, 770b is about (8×416×0.45) Newtons=1497.6 Newtons=152.8 Kilogram force. The corresponding unmating force for disconnecting with all eight connectors 772a, 774a, 776a, 778a, 772b, 774b, 776b, 778b of the GPU cards 770a, 770b is greater than 41.6 Newtons. Using the total mating force of 152.8 Kilogram force over the two fulcrums 450a, 460a (shown in FIGS. 4A-5A) in the first guiding arm 200a and the two fulcrums 450b, 460b (shown in FIGS. 4B-5B) in the second guiding arm 200b enables application of a force of only between about 3 Kilogram force and about 4 Kilogram force at the second end 203a of the first guiding arm 200a and the second end 203b of the second guiding arm 200b. This creates a mechanical advantage of up to about 1:22. Such a mechanical advantage is sufficient to efficiently engage the motherboard sled 100 into and out of the electronic chassis 700.

During disassembly, the first guiding arm 200a and the second guiding arm 200b are first unlatched from the latching mechanism 130, and then rotated from the secured position 490 to the unsecured position 510. The double fulcrum design efficiently unmates the motherboard 785 and the I/O card 790 from the GPU cards 770a, 770b, and then slides the motherboard sled 100 out from the electronic chassis 700.

Figure 9:
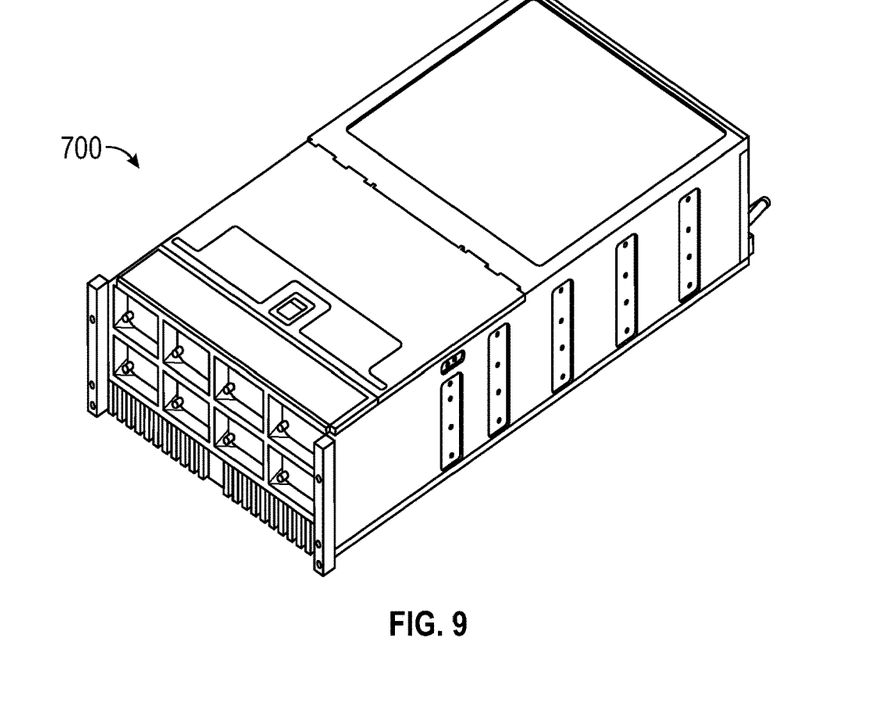
FIG. 9 shows a perspective view of an electronic chassis where the motherboard sled of FIG. 1 is used, according to certain aspects of the present disclosure.

FIG. 9 shows a perspective view of the exemplary electronic chassis 700 where the motherboard sled 100 may be used. In the non-limiting embodiment shown in FIGS. 7-9, the electronic chassis 700 belongs to a S7W 6U GPU server having a height 264.4 mm, width 447.8 mm and a length 885 mm. However, the motherboard sled 100 may be configured for use in any server.

Figure 10:
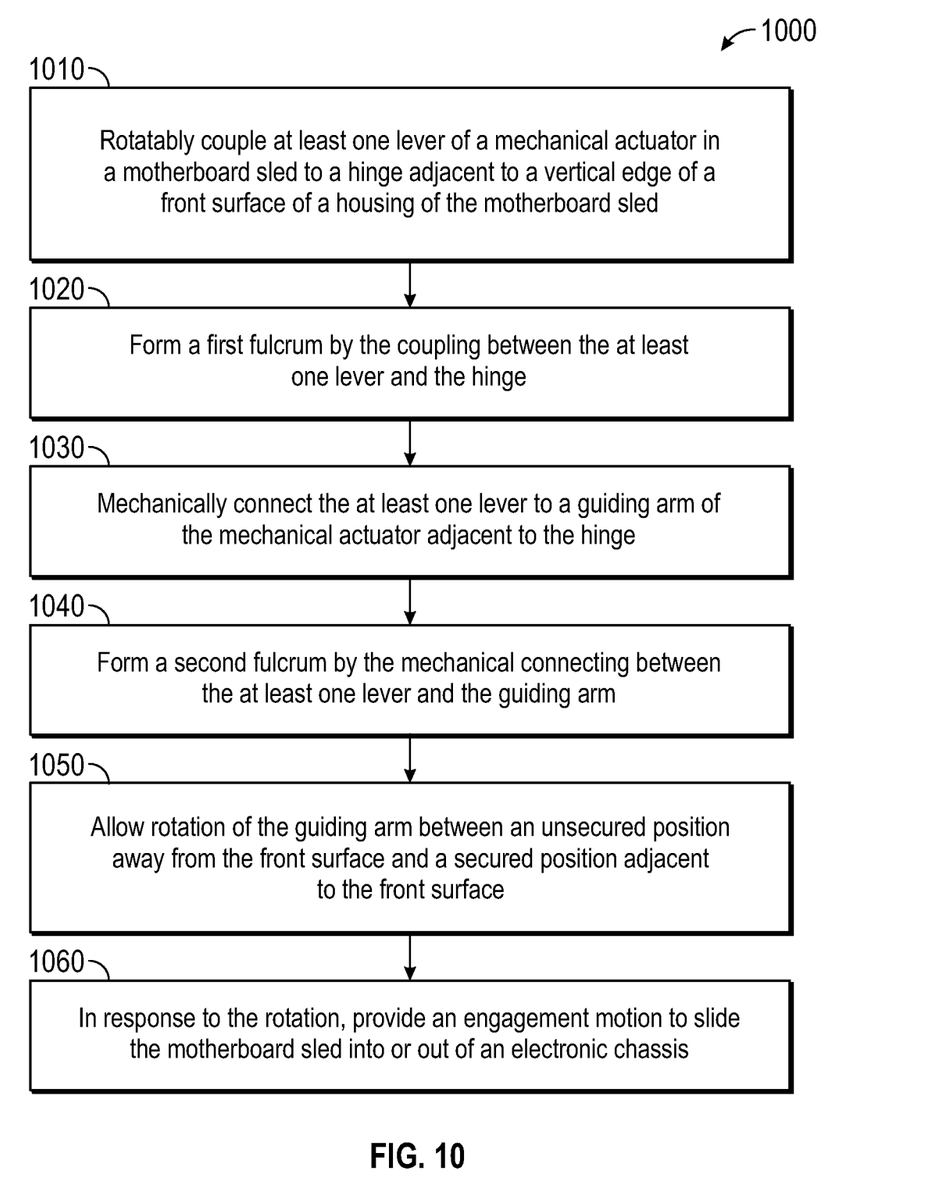
FIG. 10 shows a block diagram of a method for providing engagement between a motherboard sled and an electronic chassis, according to certain aspects of the present disclosure.

FIG. 10 shows a block diagram 1000 of a method for providing engagement between a motherboard sled and an electronic chassis. The method begins in step 1010, where at least one lever of a mechanical actuator in the motherboard sled is rotatably coupled to a hinge adjacent to a vertical edge of a front surface of a housing of the motherboard sled. In some implementations, the vertical edge is a left edge of the front surface of the housing, or a right edge of the front surface of the housing. In step 1020, a first fulcrum is formed, by the coupling between the at least one lever and the hinge.

In step 1030, the at least one lever is mechanically connected to a guiding arm of the mechanical actuator adjacent to the hinge. In some implementations, the guiding arm is further connected to the at least one lever through a linking member. In some implementations, the guiding arm includes a handle portion having a first end to which the at least one lever is mechanically connected in proximity of the hinge, and a second end on which a blade portion is formed distal from the hinge.

In step 1040, a second fulcrum is formed by the mechanical connection between the at least one lever and the guiding arm. In step 1050, the guiding arm is allowed to be rotated between an unsecured position away from the front surface and a secured position adjacent to the front surface. In step 1060, an engagement motion is provided to slide the motherboard sled into or out of the electronic chassis, in response to the rotation of the guiding arm.

Advantageously, the double fulcrum design of the mechanical actuators described herein, provides the ability to apply sufficient mating force to connect motherboard and I/O card with GPU cards within an electronic chassis of a server as well as carry weights of the motherboard sled containing the motherboard and the I/O sled containing the I/O card, with a relatively low force. The double fulcrum design makes use of two different levers to create sufficient mechanical advantage for efficiently carrying different loads by applying relatively low forces at one end of the levers. Further, the guiding arms in the mechanical actuators are designed to enable airflow around them, without blocking any venting holes through which the airflow reaches the interior space of the motherboard sled. Thus, the double fulcrum design optimizes mechanical and thermal usability within limited design space of the motherboard sled.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A motherboard sled comprising:
   a housing; and
   a mechanical actuator for engaging the motherboard sled into or out of an electronic chassis, the mechanical actuator comprising:
   at least one lever rotatably coupled to a hinge to form a first fulcrum adjacent to a vertical edge of a front surface of the housing, the at least one lever having a fulcrum-receiving portion near the first fulcrum, the fulcrum-receiving portion being curved inwardly from an exterior surface of the at least one lever towards the first fulcrum; and
   a guiding arm having a first end adjacent to the hinge and a second end distal from the hinge, the first end being mechanically connected to the at least one lever to form a second fulcrum, the guiding arm rotating between a secured position adjacent to the front surface and an unsecured position away from the front surface, the second fulcrum being disengaged and separated from the fulcrum-receiving portion in the secured position, the second fulcrum being engaged with and at least partially within the fulcrum-receiving portion in the unsecured position.

2. The motherboard sled of claim 1, wherein the guiding arm is further connected to the at least one lever through a linking member.

3. The motherboard sled of claim 1, wherein the guiding arm further comprises:
   a handle portion extending between the first end and the second end; and
   a blade portion formed at the second end.

4. The motherboard sled of claim 3, wherein the blade portion includes a ridged outer surface.

5. The motherboard sled of claim 3, wherein the mechanical actuator provides a mechanical advantage of up to about 1:22.

6. The motherboard sled of claim 1, wherein the vertical edge is a left edge of the front surface of the housing, or a right edge of the front surface of the housing.

7. The motherboard sled of claim 5, wherein the mechanical actuator further comprises:
   another lever rotatably coupled to another hinge forming a third fulcrum adjacent to a right edge of the front surface; and
   another guiding arm adjacent to the another hinge and mechanically connected to the another lever to form a fourth fulcrum, the another guiding arm rotating between a respective secured position and an unsecured position, the another guiding arm having a third end adjacent to the another hinge and a fourth end distal from the another hinge.

8. The motherboard sled of claim 7, wherein the another guiding arm further comprises:
   another handle portion extending between the third end and the fourth end; and
   another blade portion formed at the fourth end.

9. The motherboard sled of claim 8, wherein the another blade portion includes a ridged outer surface.

10. The motherboard sled of claim 1, wherein the housing further comprises a latching mechanism configured to secure the guiding arm in the secured position.

11. An electronic chassis having a motherboard sled configured to engage in or out of the electronic chassis, the motherboard sled comprising:
    a housing; and
    a mechanical actuator comprising:
      a first lever rotatably coupled to a first hinge to form a first fulcrum adjacent to a first front end of the front surface of the housing, the first lever having a fulcrum-receiving portion near the first fulcrum, the fulcrum-receiving portion being curved inwardly from an exterior surface of the first lever towards the first fulcrum;
      a first guiding arm having a first arm end adjacent to the first hinge and a second arm end distal from the first hinge, the first arm end being coupled directly to the first lever to form a second fulcrum and indirectly by a first linking member, the first guiding arm rotating between a secured position adjacent to the front surface and an unsecured position away from the front surface, the second fulcrum being disengaged and separated from the fulcrum-receiving portion in the secured position, the second fulcrum being engaged with and at least partially within the fulcrum-receiving portion in the unsecured position;
      a second lever rotatably coupled to a second hinge to form a third fulcrum adjacent to a second front end of the front surface, the second front end being opposite to the first front end; and
      a second guiding arm adjacent to the second hinge and coupled directly to the second lever to form a fourth fulcrum and indirectly by a second linking member, the second guiding arm rotating between a respective secured position adjacent to the front surface and an unsecured position away from the front surface.

12. The electronic chassis of claim 11, wherein each of the first guiding arm and the second guiding arm further comprise:
    a handle portion extending between the first arm end and the second arm end; and
    a blade portion formed at the second arm end.

13. The electronic chassis of claim 12, wherein the blade portion includes a ridged outer surface.

14. The electronic chassis of claim 12, wherein the mechanical actuator provides a mechanical advantage of up to about 1:22.

15. The electronic chassis of claim 11, wherein the first front end is a left edge of the front surface of the housing and the second front end is a right edge of the front surface of the housing.

16. The electronic chassis of claim 11, wherein the housing further comprises a latching mechanism configured to secure the first guiding arm and the second guiding arm.

17. A method for providing engagement between a motherboard sled and an electronic chassis, the method comprising:
    rotatably coupling at least one lever of a mechanical actuator in the motherboard sled to a hinge adjacent to a vertical edge of a front surface of a housing of the motherboard sled, the at least one lever having a fulcrum-receiving portion near the first fulcrum, the fulcrum-receiving portion being curved inwardly from an exterior surface of the at least one lever towards the first fulcrum;
    forming a first fulcrum by the coupling between the at least one lever and the hinge;
    mechanically connecting the at least one lever to a guiding arm of the mechanical actuator adjacent to the hinge;
    forming a second fulcrum by the mechanical connecting between the at least one lever and the guiding arm;
    allowing rotation of the guiding arm between an unsecured position away from the front surface and a secured position adjacent to the front surface;
    disengaging and separating the second fulcrum from the fulcrum-receiving portion in the secured position;
    engaging the second fulcrum with, and receiving at least partially within, the fulcrum-receiving portion in the unsecured position; and
    in response to the rotation, providing an engagement motion to slide the motherboard sled into or out of the electronic chassis.

18. The method of claim 17, wherein the guiding arm is further connected to the at least one lever through a linking member.

19. The method of claim 17, wherein the guiding arm includes a handle portion having a first end to which the at least one lever is mechanically connected in proximity of the hinge and a second end on which a blade portion is formed distal from the hinge.

20. The method of claim 17, wherein the vertical edge is a left edge of the front surface of the housing, or a right edge of the front surface of the housing.

* * * * *